(12) United States Patent
Jennings et al.

(10) Patent No.: US 8,432,613 B2
(45) Date of Patent: Apr. 30, 2013

(54) MULTI-STAGE OPTICAL HOMOGENIZATION

(75) Inventors: Dean C. Jennings, Beverly, MA (US); Timothy N. Thomas, Portland, OR (US); Samuel C. Howells, Portland, OR (US); Bruce E. Adams, Portland, OR (US); Jiping Li, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 409 days.

(21) Appl. No.: 12/762,351

(22) Filed: Apr. 18, 2010

(65) Prior Publication Data

US 2010/0266268 A1    Oct. 21, 2010

Related U.S. Application Data

(60) Provisional application No. 61/171,202, filed on Apr. 21, 2009.

(51) Int. Cl.
*G02B 27/10* (2006.01)
(52) U.S. Cl.
USPC .......................................... 359/626; 359/622

(58) Field of Classification Search .................... 359/626
See application file for complete search history.

(56) References Cited

U.S. PATENT DOCUMENTS 6,038,075 A * 3/2000 Yamazaki et al. ............ 359/626
2008/0206969 A1* 8/2008 Tanaka .......................... 438/487

FOREIGN PATENT DOCUMENTS

WO    2009/023442 A1    2/2009

OTHER PUBLICATIONS

European Search Report for European Application No. 10160623.4, mailed on Jun. 27, 2012, 7 pages.

\* cited by examiner

*Primary Examiner* — James Jones
(74) *Attorney, Agent, or Firm* — Kilpatrick Townsend & Stockton LLP

(57) ABSTRACT

Substrate processing equipment and methods are used to improve the uniformity of illumination across an illuminated portion of a substrate by processing light with multiple optical homogenizers. The multiple optical homogenizers each include micro-lens arrays and Fourier lens. The multiple optical homogenizers are arranged so that the output numerical aperture of one of the optical homogenizers is within 5% of the input numerical aperture of another optical homogenizer.

16 Claims, 6 Drawing Sheets

MULTI-STAGE OPTICAL HOMOGENIZATION

CROSS-REFERENCE TO RELATED APPLICATIONS

This application claims the benefit of U.S. Provisional Application No. 61/171,202, filed Apr. 21, 2009, which is incorporated herein by reference in its entirety for all purposes.

BACKGROUND OF THE INVENTION

In some processes used in the semiconductor industry, it is desirable to heat a substrate rapidly to reduce the portion of the thermal budget used by a process. Typically, rapid thermal processing systems utilize a high intensity light source to rapidly heat a substrate that is held within a processing chamber, sometimes under vacuum conditions. The light source, which may consist of an array of high intensity lamps, is located inside the chamber or outside of the chamber and adjacent to a transparent window through which the light passes into the chamber. Inside of the chamber the substrate is supported with very little physical contact (usually around the edge) so the substrate temperature can respond quickly to the incoming light. The front of the wafer is exposed and receives light from the high intensity lamps. The lamps are essentially black-body radiators and are heated as quickly as possible (typically 300 to 500 ms) to operating temperature. For many substrates, like silicon substrates as commonly used in the manufacture of integrated circuits, optical absorption is higher for shorter wavelengths especially at the beginning of a heating cycle when the substrate is closer to room temperature. Rapid silicon substrate heating begins after the lamps reach high temperatures (about 3000° C.) at which time the lamps begin emitting a significant portion of short wavelength light.

FIG. 1 shows a schematic cross-sectional view of a flood type rapid thermal heating apparatus in which a wafer 100 disposed in chamber 105 is heated by radiation from lamps 125 mounted on a chamber lid 120. The lamps 125 are typically tungsten-halogen lamps and may be brought to different temperatures to evenly heat the substrate. Pyrometry measurements may be made by monitoring light through windows 135 in the chamber 105. The rate with which the lamps 125 can be turned on and off is limited with typical heat lamps and results in limitations on how fast a substrate can be heated.

Alternative light sources have been used to overcome some of these limitations and to provide shorter pulse durations in order to stay within processing time targets. Annealing substrates, or their near-surface regions, with a flash lamp provides optical pulse durations from about 100 microseconds to 1 milliseconds and pulsed laser processing has been used to provide optical pulses between about 1 nanosecond about 100 nanoseconds. For pulses of short duration, spatially inhomogeneous pulses result in poor process uniformity across an illuminated portion of a substrate.

Since illumination may modify the substrate by thermal means, inhomogeneous pulses that cause thermal non-uniformities can significantly impact wafer yields. Some examples of how substrates are modified by thermal means include diffusion of dopants, exposure of photoresist, and chemical alterations or reactions that form a film on the substrate.

Therefore, a system and method for reliably and rapidly thermally processing wafers with improved uniformity is needed.

BRIEF SUMMARY OF THE INVENTION

Embodiments of the present invention pertain to substrate processing equipment which improves the uniformity of illumination across an illuminated portion of a substrate by processing light with multiple optical homogenizers.

A substrate processing system includes a support assembly for supporting a substrate and an optical assembly for illuminating a portion of the substrate. The optical assembly further includes a source of illumination of at least one wavelength, a first optical homogenizer with an output numerical aperture and a second optical homogenizer with an input numerical aperture. The first optical homogenizer includes a first micro-lens array, a second micro-lens array, and a first Fourier lens. The second optical homogenizer includes a third micro-lens array, a fourth micro-lens array, and a second Fourier lens. The output numerical aperture is within 5% of the input numerical aperture.

A method of processing a substrate includes providing a substrate, illuminating a first optical homogenizer with a first light beam, generating a second light beam using the first optical homogenizer, illuminating a second optical homogenizer with the second light beam, generating a third light beam using the second optical homogenizer, and exposing the substrate to the third light beam to modify the substrate. Exposing the substrate includes annealing the substrate which can be heating the substrate above 800 degrees Celsius or until the substrate begins to melt.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

Figure 1:
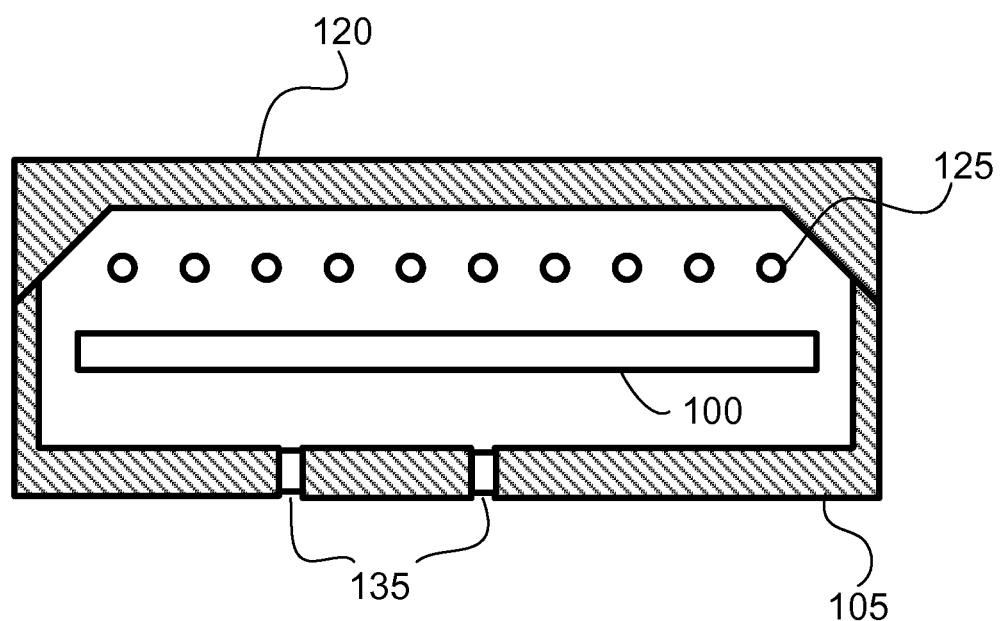
FIG. 1 is a cross-sectional schematic of a heating and monitoring system in a prior art substrate processing system.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention pertain to substrate processing equipment which improves the uniformity of illumination across an illuminated portion of a substrate by processing light with multiple optical homogenizers. In embodiments, a substrate processing system includes a support assembly for supporting a substrate, an optical assembly for illuminating a portion the substrate, and a source of illumination of at least one wavelength. The optical assembly includes a first optical homogenizer with an output numerical aperture and a second optical homogenizer with an input numerical aperture. The first optical homogenizer further includes a first micro-lens array, a second micro-lens array, and a first Fourier lens whereas the second optical homogenizer includes a third micro-lens array, a fourth micro-lens array, and a second Fourier lens. The output numerical aperture is within 5% of the input numerical aperture. In other embodiments, methods of processing a substrate include providing a substrate, illuminating a first optical homogenizer with a first light beam, generating a second light beam using the first optical homogenizer, illuminating a second optical homogenizer with the second light beam, generating a third light beam using the second optical homogenizer, and exposing the substrate to the third light beam to heat the substrate.

High intensity light sources often involve using continuous lasers to form the light. Higher intensity light sources can be achieved by forming pulses of light generated with pulsed lasers. Substrates can be processed using a wide range of light intensities depending on the process and the way the substrate is to be modified. Lasers can produce single mode output or multi-mode outputs which vary spatially across the produced beam of illumination. For example, when using pulses that are significantly longer than 1 millisecond, thermal treatments become less sensitive to inhomogeneous illumination since the heat is able to propagate through the substrate creating an even heat profile. Short pulses can result in process variation across an illuminated portion of a substrate.

Short pulses may be created by YAG lasers, such as a Nd:YAG laser, or with an excimer laser commonly used in photolithography. Excimer laser wavelengths are readily absorbed by silicon substrates but substrates may be transparent to some YAG laser wavelengths. Non-linear crystals may be used, in these cases, to double or triple the frequencies of the YAG laser which reduces the wavelength and may enhance absorption. Source wavelengths of less than about 1 µm, less than about 0.75 µm or less than about 0.60 µm are used to promote absorption, in different embodiments. These lasers may be customized to possess varying temporal and spatial coherence lengths and they may have one or more electromagnetic modes. A very uniform beam can be created by using only a portion of the beam. Applications which require near maximum available power or require high efficiency for some other reason cannot afford to lose the optical intensity required to implement this technique.

An alternative, optical homogenizers, can be used to even out optical intensity profiles while retaining the vast majority of the pre-homogenized intensity. Light pipe homogenizers can be used for sources which emit in many directions, such as incandescent and some LED light sources. Lasers emit highly collimated illumination and may require a different approach to homogenization regardless of whether the beam is expanded or expanding upon entering the optical homogenizer. High intensity lasers may damage light pipes further motivating alternative homogenization methods.

Figure 2:
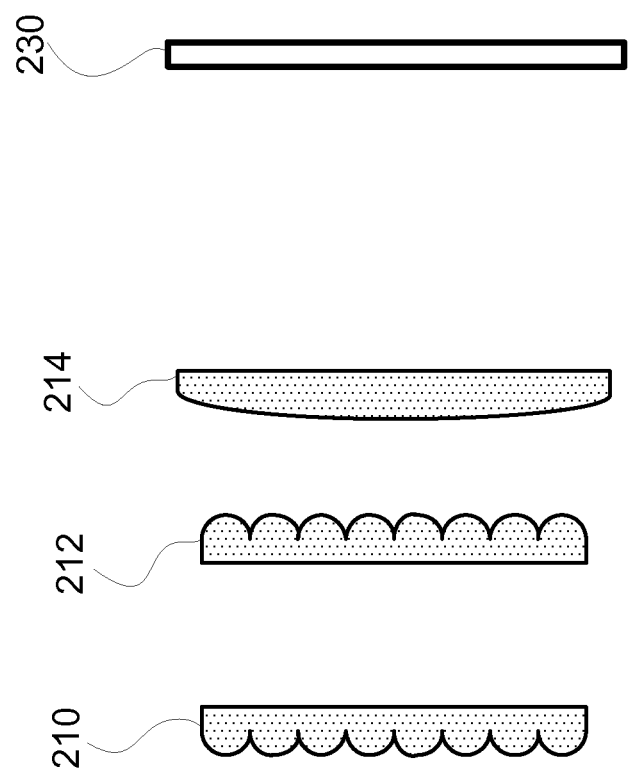
FIG. 2 is a schematic of a 64-element square fly's eye optical homogenizer.

FIG. 2 is a schematic of a 64-element square fly's eye optical homogenizer including a first lens array 210, a second lens array 212 and a Fourier lens 214 illuminating a substrate 230 separated from the Fourier lens 214 by about the focal length of Fourier lens 214. The first lens array 210 and the second lens array 212 of the fly's eye homogenizer may be substantially identical 2-dimensional lens arrays of discrete imaging lenses parallel to one another and separated by the focal length of the lenses. In alternative embodiments, individual lenses in the first lens array 210 are coaxial with individual lenses in the second lens array 212, but may have different perimeter shapes and/or focal lengths. A "Fourier" lens 214 is positioned after the pair of lens arrays 210, 212 and its separation from the second lens array 212 may be varied without significantly altering the output homogenization.

In this embodiment, each lens array measures eight lenses on a side and has a 1:1 aspect ratio. During operation, collimated light first traverses through the first lens array 210 and then traverses through the second lens array 212 and finally traverses the Fourier lens 214 before illuminating a portion of substrate 230 positioned at about the imaging plane of Fourier lens 214. Alternatively, collimated light may be processed by an optical diffuser before the first lens array 210 to intentionally de-collimate the light. The illuminated portion of the substrate 230 illuminates a portion of substrate 230 having a perimeter similar to the shape of the lens in the lens arrays. In embodiments where each individual lens of the first lens array 210 and each individual lens of the second lens array 212 are square the pattern formed on the substrate 230 is also square. In other embodiments where each individual lens of the first lens array 210 are different from each individual lens of the second lens array 212 (but still coaxial), the perimeter of the illuminated region of substrate 230 is similar to the shape of the lenses in first lens array 210. The pitch of the two lens arrays 210, 212 are identical.

In addition to square shapes, exemplary lens elements may be rectangular, circular, oval, hexagonal and triangular. A square shape, however, facilitates tiling of a substrate during processing. The lens arrays also ought to be tiled as completely as possible with the chosen shape in order to limit light losses which reduce the overall optical efficiency. This constraint typically will make it desirable to make the shapes of lenses in the first lens array 210 the same or similar to the shapes of lenses in the second lens array 212. For some lens shapes, e.g. hexagonal, optimal tiling may require adjacent rows or columns to differ to achieve an optimal optical efficiency.

For a 64-element square fly's eye optical homogenizer, the variation of the illuminated portion of the substrate 230 may be approximately reduced by a factor of 8 (or less) if the original illumination varies linearly across the first lens array 210. Higher density arrays are possible, such as micro-lens arrays which are arrays of smaller lenses manufactured together, and may be used in place of fly's eye lens arrays to improve the homogeneity further. In this way it is possible to have a square array of lenses with thousands of lenses on a side. A lens array with one thousand lenses on a side may improve the homogenization of a linearly varying intensity by a factor of one thousand, however, high density lens arrays introduce diffractive effects which may degrade the homogeneity.

Figure 3:
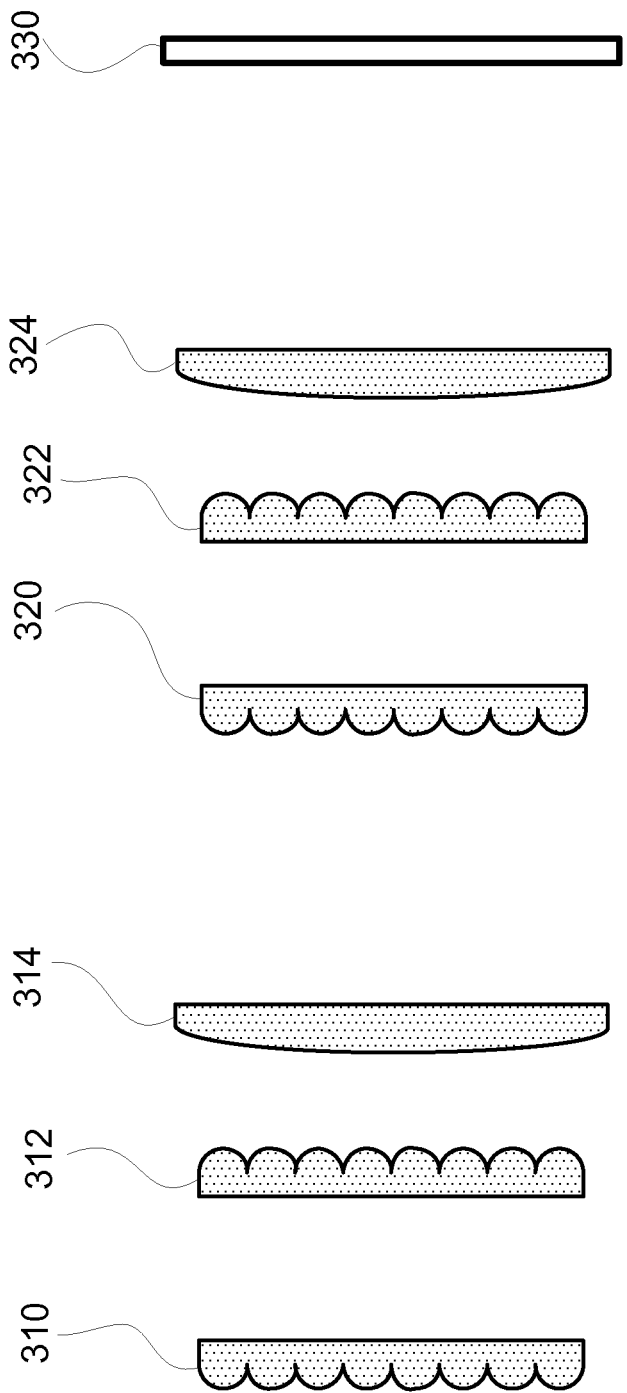
FIG. 3 is a schematic of a two stage 64-element square fly's eye optical homogenizer according to embodiments of the invention.

FIG. 3 illustrates a two stage 64-element square fly's eye optical homogenizer that can be used to improve the homogeneity of the illumination on the surface of a substrate 330 without the risk of introducing excessive diffractive effects. The two stage 64-element square fly's eye optical homogenizer includes a first lens array 310, a second lens array 312, a first Fourier lens 314, a third lens array 320, a fourth lens array 322, and a second Fourier lens 324. Illumination from a pulsed laser traverses the first lens array 310, the second lens array 312, which are separated by the focal length of the second lens array 312, and the first Fourier lens 314 positioned after the pair of lens arrays 310, 312. The output of the first Fourier lens 314 forms an illumination, which has been homogenized by one stage, that traverses the third lens array 320, the fourth lens array 322, which are separated by the focal length of the fourth lens array 322, and the second Fourier lens 324. The third lens array 320 is positioned where the substrate 230 had been positioned in FIG. 2. The second Fourier lens 324 is positioned after the pair of lens arrays 320, 322, which is homogenized by two stages. The light coming out of the second Fourier lens 324 impacts a portion of substrate 330 positioned so the separation of substrate 330 and Fourier lens 324 is about the focal length of Fourier lens 324.

The two-stage homogenizer (shown in FIG. 3) may reduce a linear inhomogeneity by a factor of 64 or less. In practice, the first stage may improve the uniformity substantially depending upon many source parameters, such as spatial and temporal coherence lengths and input beam uniformity. The improvement in the second stage is typically much less than a factor of 64 and may be as relatively small. However, an additional 1 to 10 percent can be important for pulsed laser processes. Herein, inhomogeneity of illumination at the position of substrate 330 will be quantified as a percentage unless otherwise noted and represent one standard deviation about the average of spatially separated intensity measurements across the profile of the illumination.

An illuminated portion of a substrate with an inhomogeneity between 1% and 2% is sufficient for some rapid thermal processing operations. Additional embodiments which produce lower inhomogeneity may prove useful in other rapid thermal processes and some nonlinear beam intensity profiles may require these additional embodiments to attain inhomogeneity in the 1% to 2% range. A two-stage homogenizer, analogous to that of FIG. 3, may be created using micro-lens arrays in place of the relatively coarser 64-element lens array to reduce the inhomogeneity further. A micro-lens may be used in place of the first pair of lens arrays (310, 312), the second pair of lens arrays (320, 322), or both pairs.

Diffractive effects become more significant as the spatial coherence length becomes comparable and larger than the lens pitch. This can occur when the micro-lenses become very small or the beam is expanded. In embodiments the pitch between optical elements in each lens array is above 0.1 mm or above 0.2 mm in order to limit diffractive effects. Diffractive effects may also be produced for large areas of illumination of the micro-lens arrays. Such an area may be limited to below about 2000 mm$^2$ or below about 1000 mm$^2$, in embodiments, also to limit diffractive effects. More than two stages may be used in embodiments of the invention.

Exemplary micro-lens arrays with a square illuminated portion may have about 100 lenses on a side and a pitch of 250 μm. This configuration limits diffractive effects and improves the homogenization significantly. The homogenization may be less than about 2.0%, less than about 1.5% and less than about 1.0% in different embodiments, enabling many more rapid thermal processes to employ short pulse duration lasers.

In order to reliably achieve such high homogeneity in combination with a high optical efficiency, the two stages need to be chosen and positioned properly. The light output from the first stage has a numerical aperture (NA) which characterizes the angle of divergence of light emerging from the first Fourier lens (the first stage). The second stage should be chosen and positioned so the emerging light from the first stage illuminates the desired number of lenses (e.g. 10,000 in the example above) and the emerging light is collected and focused efficiently so the optical assembly (the two optical homogenizers, together) transmits light with high efficiency. The optical efficiency may be more than 95% or more than 97% in different embodiments. Maintaining similar NA's for the output of the first stage and the input of the second stage results in a balance between the optical transmission efficiency of the optical assembly and the homogeneity of the illumination profile on the substrate surface. The two NA's can differ depending on the process. In one embodiment the two NA's differ by less than about 10%. In another embodiment the two NA's may differ by less than about 5%. In yet other embodiment the two NA's may differ by less than about 3%.

Figure 4:
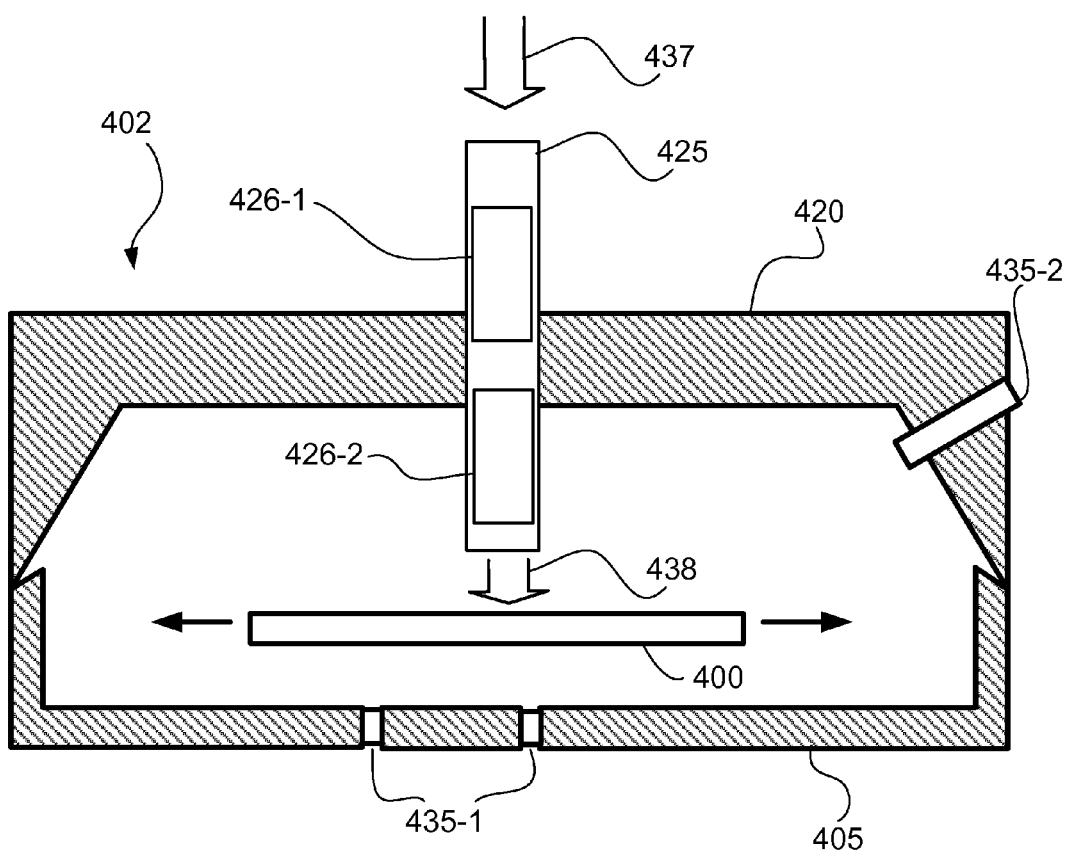
FIG. 4 is a schematic view of a substrate processing system according to embodiments of the invention.

FIG. 4 is a schematic view of an exemplary substrate processing system which includes two homogenization stages in an optical assembly 425. Included within optical assembly 425 are a first optical homogenizer 426-1 and a second homogenizer 426-2 which homogenize an optical profile of incoming light 437 which may enter the optical assembly 425 from above. A homogenized optical beam 438 exits the optical assembly 425 at the bottom, in this embodiment, and illuminates a portion of the substrate 400 positioned within processing chamber 402. The interior of the processing chamber is bounded by the processing chamber body 405 and a chamber lid 420. The optical assembly 425 may be positioned inside the processing chamber 402, partially outside, or entirely outside the processing chamber 402. It may be physically supported by the chamber lid 420, as shown, and may be protected from process conditions by a transparent window. The illuminated portion of the substrate 400 may be selected by moving the substrate in two independent directions within the plane of substrate 400. One of the two independent directions is indicated with arrows in FIG. 4. The substrate may be moved in between one or more laser pulse exposures or the substrate can be moved smoothly during a consistent exposure. As an alternative to moving the substrate 400, the optical assembly 425 may be moved while the substrate 400 remains stationary.

Pyrometers 435 may be used to determine the temperature of the substrate at various locations. In the processing chamber 402 depicted in FIG. 4, the angled pyrometer 435-2 situated to collect light from the illuminated portion of the substrate 400 would provide the greatest utility for short optical pulse durations.

Exemplary Substrate Processing System

Figure 5:
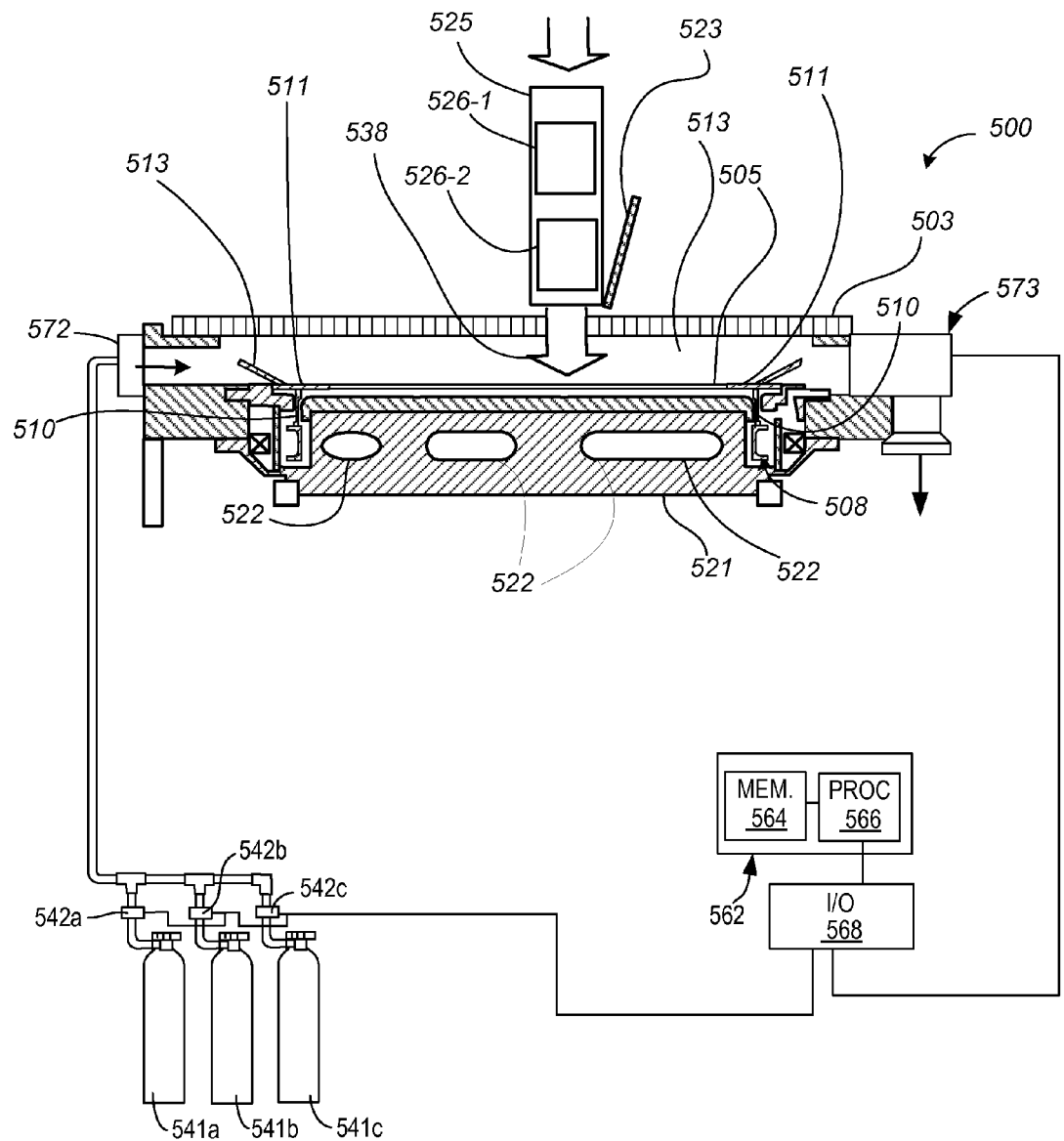
FIG. 5 is a cross-sectional view of an exemplary substrate processing system which benefits from embodiments of the invention.

FIG. 5 shows a processing chamber 500 for processing disk-shaped substrates 505 which may be twelve-inch (300 millimeter (mm)) diameter silicon (Si) wafers.

During processing, the substrate 505 is supported inside chamber 500 on a substrate support assembly 508 and a region of the substrate is heated by illumination 538 originating from a Nd:YAG laser and subsequently processed by an optical homogenizer 525 with a first homogenization stage 526-1 and a second homogenization stage 526-2, as described above with reference to FIG. 3 and FIG. 4. The optical homogenizer 525 may be inside or outside processing chamber 500 and the illumination may enter the chamber through a water-cooled quartz window assembly 503. The illuminated region of substrate 505 may be varied by changing the relative position of the substrate and the illumination source. In chamber 500 the substrate 505 is fixed and illuminated region of substrate 505 may be varied by translating optical homogenizer 525 laterally in two dimensions, thereby tiling the surface of substrate 505. Beneath substrate 505 is a central assembly 521 having a generally cylindrical base.

Pyrometric probes (one shown in FIG. 5) may be used to monitor the temperature within the illuminated region of substrate 505 from the topside by collecting light through a light pipe 523, possibly affixed to optical homogenizer 525 so the illuminated portion of substrate 505 is always monitored, and measuring the intensity of the detected light with optical sensors. Short optical pulses from the Nd:YAG laser cause the top of the substrate to be heated while the bottom remains at a much lower temperature, therefore, the light pipe collects light emanating from the top of substrate 505. Light pipe 523 may be 0.080 inch in diameter and can be optically connected to optical sensors via fiber optics. The intensity is converted to a temperature generally within a pyrometer control module and the temperature is reported back to a system controller 562. Alternatively, intensity information may be reported to the system controller 562 and the temperature determined therein.

A processing region 513 is located above substrate 505. The substrate is modified by shining light 538 towards substrate 505 which may reorder the substrate and/or assist chemical reactions involving process gases and substrate 505. For example, dopants within the substrate 505 may be activated or dispersed, the degree of order in the substrate 505 may be increased or a film (such as a silicide, nitride or oxide) may be grown on the substrate 505. An inlet manifold 572 is positioned in the side wall of chamber 500 and is adapted to admit gas from a source of gas or gases, such as tanks 541, into the chamber 500. The flow of gases from tanks 541 are preferably independently controlled with manual valves and computer controlled flow controllers 542. An exhaust cap 573 is positioned in the side of chamber 500 diametrically opposite inlet manifold 572 and is adapted to exhaust process effluents from the deposition chamber 500 into a pumping system (not shown).

Central assembly 521 includes a circulation circuit including interior chambers 522 coupled to coolant inlets (not shown) through which a cooled fluid circulates in order to cool central assembly 521. Room temperature water is used in an embodiment to maintain central assembly 521 well below the temperature of heated substrate 505. The temperature of central assembly 521 is kept below 150° C. in embodiments.

Light pipe 523 may be made of a high optical index material such as sapphire. Sapphire light pipes are generally preferred as they have relatively small light scattering coefficients, and they tend to have greater transverse light rejection. As a result they provide greater measurement localization because they accept incoming rays from a smaller solid angle and thus a smaller area of measurement. The light pipes can be made of any appropriate heat-tolerant and corrosion-resistant material, e.g., quartz that can transmit the sampled radiation to the pyrometer possibly through intervening fiber optic cables. Alternatively, the radiation sampling system could be an optical system that includes a small-radius objective lens and a system of mirrors and lenses which communicate radiation collected by each lens to each pyrometer. Such a scheme may be less expensive than sapphire light pipes if appropriate off-the-shelf optical elements are available. Alternatively, light pipes can be made from a tube that has a highly polished reflective inner surface.

Along the inner diameter of edge ring 511 may be a shelf or wedge shape for contacting substrate 505. Edge ring 511 contacts the substrate 505 around the outer perimeter of substrate 505, thereby obscuring a minimal portion of the underside of substrate 505. Edge ring 511 has a radial width of approximately 0.75 inch. Portions of edge ring 511 are close to substrate 505 and may be subject to corrosion or contamination by process gases selected to form a film or otherwise modify substrate 505. The material used for edge ring 511 may be resistant to chemical attack such as silicon carbide.

Edge ring 511 is designed to create a light tight seal with a cylinder 510 in case additional pyrometric measurements on the underside of substrate 505 are desired. Extending from the bottom surface of edge ring 511 is a cylindrically-shaped lip or skirt which has an outside diameter that is slightly larger or smaller than the outside diameter of cylinder 510 preventing light from traveling directly between the regions outside and inside the cylinder 510. Edge ring 511 has an outer radius that is larger than the radius of cylinder 510 so that it extends out beyond cylinder 510. This annular extension of edge ring 511 beyond cylinder 510 functions as a baffle which prevents stray light from entering the region below substrate 505 and above central assembly 521 and being misinterpreted as indicative of substrate temperature. To further reduce the possibility of stray light entering the region below substrate 505 and above central assembly 521, edge ring 511 may be coated with a material that absorbs stray illumination originating from optical homogenizer 525 (e.g., a black or grey material such as silicon carbide). To further reduce the amount of stray light beneath substrate 505, an edge ring extension 513 may be used. Cylinder 510 may be made of quartz and may be coated with Si to further limit the intrusion of light below substrate 505.

Processing apparatus 500 includes a system controller 562 which controls various operations of apparatus 500 such as controlling the Nd:YAG laser intensity, gas flows, substrate temperature, and chamber pressure. In an embodiment of the present invention the system controller 562 includes a hard disk drive (memory 564) and a processor 566. The processor contains a single board computer (SBC), analog and digital input/output boards 568 as well as mechanical interface boards.

System controller 562 controls the activities of the apparatus 500. The system controller executes system control software, which is a computer program stored in a computer-readable medium such as a memory 564. In one embodiment memory 564 can be a hard disk drive. In other embodiments, memory 564 can be DRAM, flash or other kinds of memory. Memory 564 may also be a combination of one or more types of memory. The computer program includes sets of instructions that dictate the timing, mixture of gases, chamber pressure, chamber temperature, lamp power levels, pedestal position, and other parameters of a particular process. Of course, other computer programs such as one stored on another memory device including, for example, a floppy disk or another appropriate drive, may also be used to operate system controller 562. Input/output (I/O) devices 568, in addition to interfacing with the equipment, may include human interface devices such as an LCD monitor, a keyboard and a pointing device. System controller 562 may be connected to a network to allow remote control or monitoring of system functions. Control may also be distributed among multiple system controllers 562 which communicate over a network in order to distribute control responsibilities.

Figure 6:
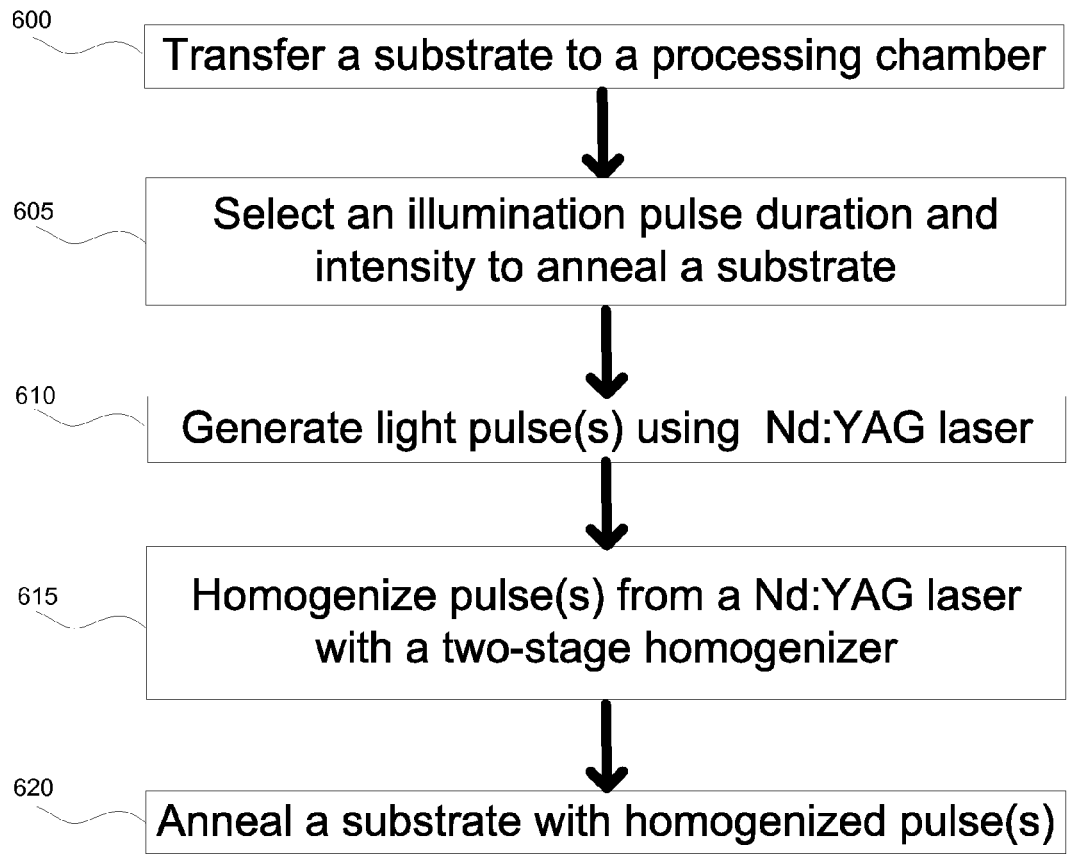
FIG. 6 is a flow chart illustrating operations used to process a substrate with a two stage optical homogenizer according to embodiments of the invention.

FIG. 6 is a flowchart showing an exemplary method which may be used to treat the surface of a substrate according to disclosed embodiments. In operation 600, a substrate is transferred into a processing chamber such as an RTP chamber, as described above with reference to FIG. 5. In operation 605, an illumination pulse duration and intensity are chosen so the pulse(s) have sufficient power to anneal a substrate. In some embodiments the pulse duration and intensity are chosen to increase the substrate temperature to at least 800 degrees Celsius or to increase the temperature of the substrate up to the melting temperature. In operation 610, the illumination light pulse(s) are generated using a Nd:YAG laser. Next, in operation 615, the illumination light pulse(s) generated with the Nd:YAG laser are homogenized in a two-stage homogenizer. The illumination light pulse(s) are homogenized by illuminating a first optical homogenizer to generate a second light beam which has been homogenized once and then illuminating a second optical homogenizer with the second light beam to generate a third light beam which has been homogenized twice. In operation 620, the substrate is modified by exposing the substrate to the twice homogenized light. Exposing the substrate to the twice homogenized light anneals the substrate by causing the substrate to heat up.

As used herein "substrate" may be a support substrate with or without layers formed thereon. Some or all the layers and even the substrate may be patterned. The support substrate may be an insulator or a semiconductor of a variety of doping concentrations and profiles and may, for example, be a semiconductor substrate of the type used in the manufacture of integrated circuits. Use of the terms "light", "optical" and "optics" does not carry any implication that the electromagnetic radiation involved must be from the visible portion of the spectrum. The light can be of any wavelength.

In one embodiment, a substrate processing system includes a support assembly for supporting a substrate and an optical assembly for illuminating a portion of the substrate. The optical assembly further includes a source of illumination of at least one wavelength, a first optical homogenizer with an output numerical aperture and a second optical homogenizer with an input numerical aperture. The first optical homogenizer includes a first micro-lens array, a second micro-lens array, and a first Fourier lens. The second optical homogenizer includes a third micro-lens array, a fourth micro-lens array, and a second Fourier lens. The output numerical aperture is within 5% of the input numerical aperture.

In another embodiment, the third micro-lens array is disposed at substantially the focal plane of the first Fourier lens.

In yet another embodiment, a portion of the substrate receives a spatial distribution of optical intensities with a standard deviation of less than about 1%.

In yet another embodiment, a portion of the substrate receives a spatial distribution of optical intensities with a standard deviation of less than about 0.5%.

In yet another embodiment, the optical assembly transmits more than 95% of collimated incoming light to the portion of the substrate.

In yet another embodiment, one or more of the at least one wavelength is less than about 1 µm.

In yet another embodiment, the source of illumination includes an excimer laser.

In yet another embodiment, the source of illumination includes a Nd:YAG laser.

In yet another embodiment, the source of illumination further includes a non-linear crystal for doubling a frequency of the Nd:YAG laser.

In another embodiment, a method of processing a substrate includes providing a substrate, illuminating a first optical homogenizer with a first light beam, generating a second light beam using the first optical homogenizer, illuminating a second optical homogenizer with the second light beam, generating a third light beam using the second optical homogenizer, and exposing the substrate to the third light beam to modify the substrate.

In yet another embodiment, the operation of exposing the substrate includes heating the surface of the substrate.

In yet another embodiment, the operation of exposing the substrate includes heating the substrate until the substrate begins to melt.

In yet another embodiment, the operation of exposing the substrate includes heating the substrate above 800 degrees Celsius.

In yet another embodiment, the operation of generating a second light beam using the first optical homogenizer includes passing the first light beam through a first micro-lens array, a second micro-lens array and a first Fourier lens.

In yet another embodiment, the operation of generating a third light beam using the second optical homogenizer includes passing the second light beam through a third micro-lens array, a fourth micro-lens array and a second Fourier lens.

In yet another embodiment, the method of processing a substrate further includes providing an incoming beam and splitting the incoming beam into a multiplicity of beams, wherein the multiplicity of beams includes the first light beam.

In yet another embodiment, the second light beam is generated to have a plurality of angles that substantially fill the numerical aperture of the second homogenizer lens array.

In yet another embodiment, the second light beam is generated to have a plurality of angles that are within ±5% of the numerical aperture of the second homogenizer lens array It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A substrate processing system, comprising;
   a support assembly to support a substrate; and
   an optical assembly to illuminate a portion of the substrate, the optical assembly comprising:
      a source of illumination configured to generate a light beam of at least one wavelength;
      a first optical homogenizer with an output numerical aperture, comprising:
         a first micro-lens array arranged to receive the light beam and output a first light beam;
         a second micro-lens array arranged to receive the first light beam and output a second light beam; and
         a first Fourier lens arranged to receive the second light beam and output a third light beam;
      a second optical homogenizer with an input numerical aperture, comprising:
         a third micro-lens array arranged to receive the third light beam and output a fourth light beam;
         a fourth micro-lens array arranged to receive the fourth light beam and output a fifth light beam; and
         a second Fourier lens arranged to receive the fifth light beam and output a sixth light beam to illuminate the portion of the substrate;
      wherein the output numerical aperture is within 5% of the input numerical aperture.

2. The substrate processing system of claim 1 wherein the third micro-lens array is disposed at substantially the focal plane of the first Fourier lens.

3. The substrate processing system of claim 1 wherein the portion of the substrate receives a spatial distribution of optical intensities with a standard deviation of less than about 1%.

4. The substrate processing system of claim 1 wherein the portion of the substrate receives a spatial distribution of optical intensities with a standard deviation of less than about 0.5%.

5. The substrate processing system of claim 1 wherein the optical assembly transmits more than 95% of collimated incoming light to the portion of the substrate.

6. The substrate processing system of claim 1 wherein one or more of the at least one wavelength is less than about 1 µm.

7. The substrate processing system of claim 1 wherein the source of illumination comprises an excimer laser.

8. The substrate processing system of claim 1 wherein the source of illumination comprises a Nd:YAG laser.

9. The substrate processing system of claim 8 wherein the source of illumination further comprises a non-linear crystal to double a frequency of the Nd:YAG laser.

10. A method of processing a substrate comprising:
providing a substrate;
illuminating a first optical homogenizer with a first light beam by:
  passing the first light beam through a first micro-lens array, a second micro-lens array, and a first Fourier lens to produce a second light beam; thereafter
outputting the second light beam from the first optical homogenizer;
illuminating a second optical homogenizer with the second light beam by:
  passing the second light beam through a third micro-lens array, a fourth micro-lens array, and a second Fourier lens to produce a third light beam; thereafter
outputting the third light beam from the second optical homogenizer; and
exposing the substrate to the third light beam to modify the substrate.

11. The method of claim 10 wherein the operation of exposing the substrate comprises heating the surface of the substrate.

12. The method of claim 10 wherein the operation of exposing the substrate comprises heating the substrate until the substrate begins to melt.

13. The method of claim 10 wherein the operation of exposing the substrate comprises heating the substrate above 800 degrees Celsius.

14. The method of claim 10 further comprising:
providing an incoming beam;
splitting the incoming beam into a multiplicity of beams, wherein the multiplicity of beams comprises the first light beam.

15. The method of claim 10 wherein the second light beam is generated to have a plurality of angles that substantially fill the numerical aperture of the second homogenizer lens array.

16. The method of claim 10 wherein the second light beam is generated to have a plurality of angles that are within ±5% of the numerical aperture of the second homogenizer lens array.

* * * * *